(12) United States Patent
Kim et al.

(10) Patent No.: US 7,646,141 B2
(45) Date of Patent: Jan. 12, 2010

(54) PHOSPHOR, LIGHT EMITTING DEVICE BY USING THE SAME AND MANUFACTURING METHOD OF THE SAME

(75) Inventors: Chang Hae Kim, Daejeon-si (KR);
Joung Kyu Park, Daejeon-si (KR);
Sang Kee Kim, Gwangjoo-si (KR);
Chung Ryeol Kim, Gwangjoo-si (KR);
Kyoung Jae Choi, Choongchung-do (KR)

(73) Assignees: LG Innotek Co., Ltd., Seoul (KR);
Korea Research Institute of Chemical Technology, Daejeon (KR)

( * ) Notice: Subject to any disclaimer, the term of this patent is extended or adjusted under 35 U.S.C. 154(b) by 230 days.

(21) Appl. No.: 10/578,140

(22) PCT Filed: Jul. 26, 2005

(86) PCT No.: PCT/KR2005/002411

§ 371 (c)(1),
(2), (4) Date: May 3, 2006

(87) PCT Pub. No.: WO2006/043747

PCT Pub. Date: Apr. 27, 2006

(65) Prior Publication Data

US 2007/0080363 A1    Apr. 12, 2007

(30) Foreign Application Priority Data

Oct. 18, 2004    (KR) ............... 10 2004 0083187

(51) Int. Cl.
*H01J 1/62*    (2006.01)
(52) U.S. Cl. ............... 313/486; 257/79; 252/301.4 F
(58) Field of Classification Search ............... 313/486, 313/500–512; 257/79; 252/301.4 F
See application file for complete search history.

(56) References Cited

U.S. PATENT DOCUMENTS 3,651,363 A    3/1972    Barry (Continued)

FOREIGN PATENT DOCUMENTS

CN    1289456 A    3/2001

(Continued)

OTHER PUBLICATIONS

Jong Su Kim et al., "GaN-Based White-Light-Emitting Diodes Fabricated with a Mixture of $Ba_3MgSi_2O_8:Eu^{2+}$ and $Sr_2SiO_4:Eu^{2+}$ Phosphors", Japanese Journal of Applied Physics, vol. 43, No. 3, Mar. 1, 2004, pp. 989-992, XP-001232131.

(Continued)

*Primary Examiner*—Nimeshkumar D. Patel
*Assistant Examiner*—Mary Ellen Bowman
(74) *Attorney, Agent, or Firm*—Birch, Stewart, Kolasch & Birch, LLP

(57) ABSTRACT

Disclosed are a phosphor, which a light emitting device using the phosphor, and a method for producing the phosphor, which allows to control color coordinates, color temperatures and color rendering indexes by shifting a main emission peak without a decrease in light emission luminosity by changing the concentration of an activator included in a phosphor. By this structure, it is possible to actively control the state of white light according to use, thereby enhancing user convenience.

26 Claims, 2 Drawing Sheets

U.S. PATENT DOCUMENTS

| | | | |
|---|---|---|---|
| 6,621,211 B1 * | 9/2003 | Srivastava et al. | 313/503 |
| 2002/0063301 A1 | 5/2002 | Hanamoto et al. | |
| 2003/0085853 A1 | 5/2003 | Shiiki et al. | |
| 2004/0104391 A1 * | 6/2004 | Maeda et al. | 257/79 |
| 2004/0245532 A1 | 12/2004 | Maeda et al. | |

FOREIGN PATENT DOCUMENTS

| | | |
|---|---|---|
| EP | 1 367 655 A1 | 12/2003 |
| JP | 11-246857 A | 9/1999 |
| JP | 2000-183408 A | 6/2000 |
| JP | 2000-509912 A | 8/2000 |
| JP | 2001-143869 A | 5/2001 |
| JP | 14-171000 A | 6/2002 |
| JP | 15-110150 A | 4/2003 |
| JP | 16-179644 A | 6/2004 |
| KR | 2004-29313 A | 4/2004 |
| KR | 2004-37229 A | 5/2004 |
| WO | WO 03/032407 A1 * | 4/2003 |
| WO | WO 2005/027231 A1 | 3/2005 |
| WO | WO 2006/022793 A2 | 3/2006 |

OTHER PUBLICATIONS

Jong Su Kim et al., "White-light generation through ultraviolet-emitting diode and white-emitting phosphor", Applied Physics Letters, vol. 85, No. 17, Oct. 25, 2004, pp. 3696-3698, XP-012063060.

Joung Kyu Park et al., "White light-emitting diodes of GaN-based $Sr_2SiO_4$:Eu and the luminescent properties", Applied Physics Letters, vol. 82, No. 5, Feb. 3, 2003, pp. 683-685, XP-012034676.

* cited by examiner

[Fig. 1]
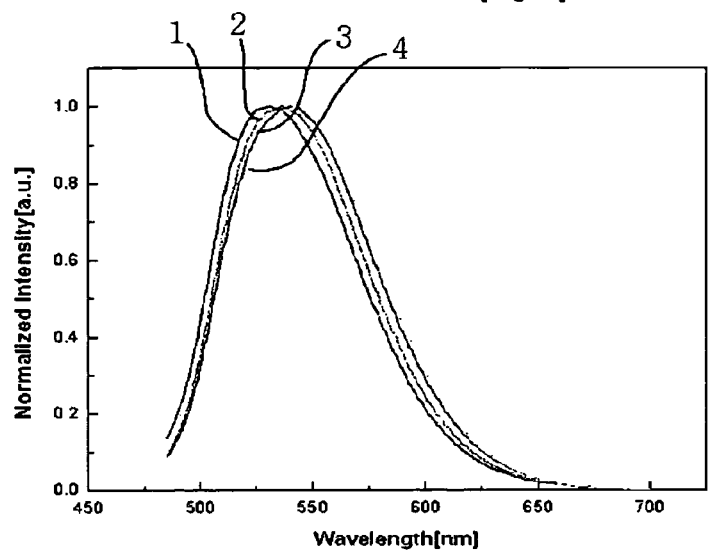
[Fig. 2]
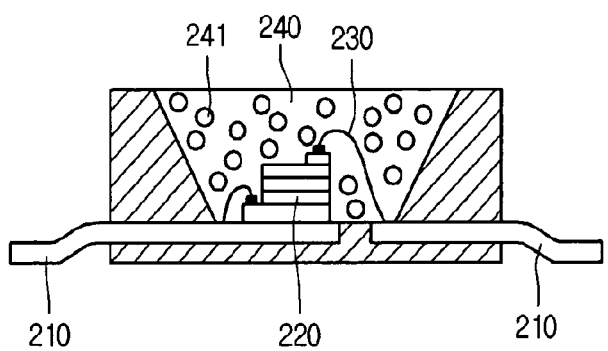
[Fig. 3]
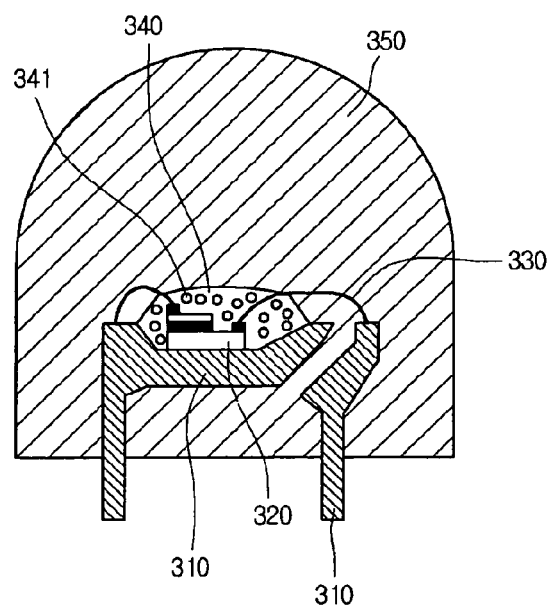

[Fig. 4]
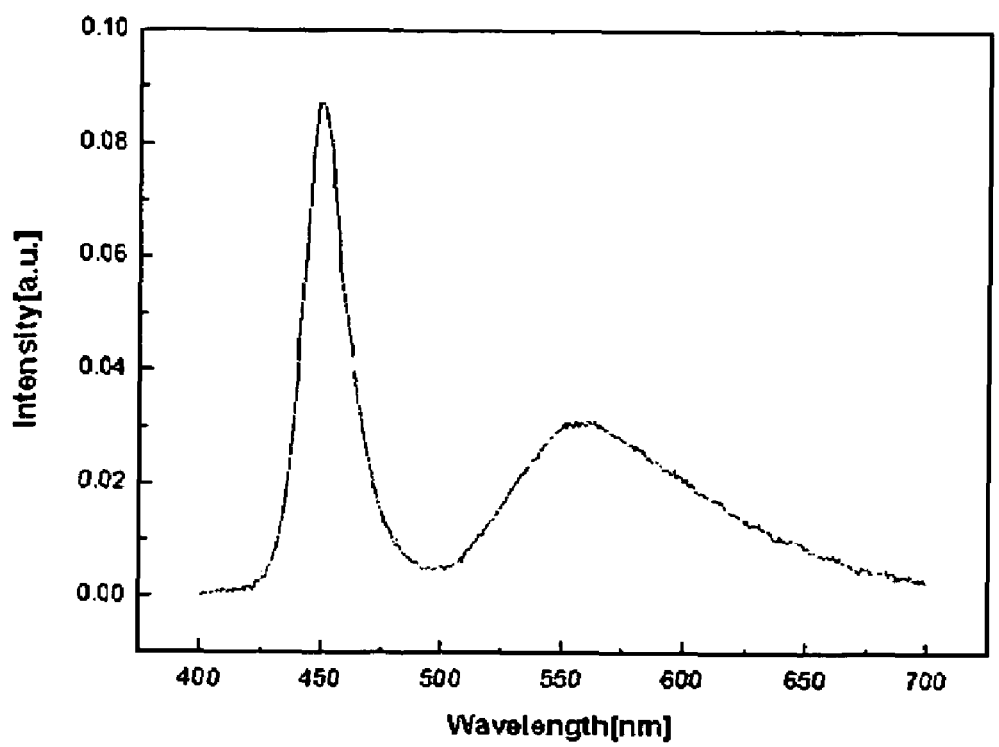
[Fig. 5]
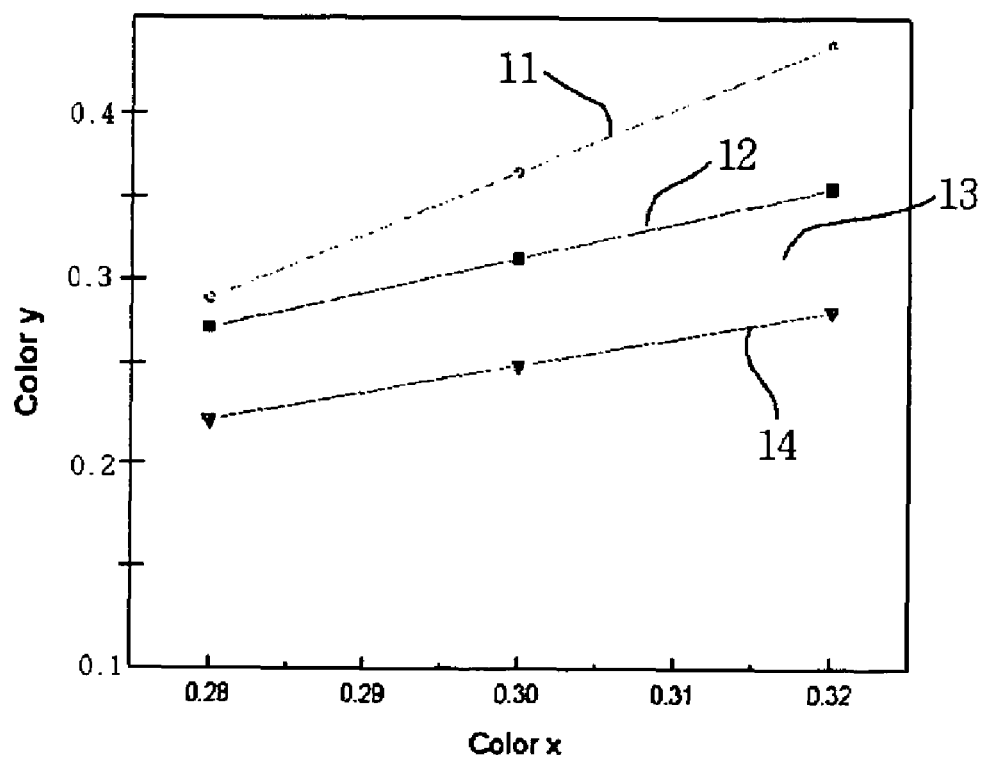

PHOSPHOR, LIGHT EMITTING DEVICE BY USING THE SAME AND MANUFACTURING METHOD OF THE SAME

TECHNICAL FIELD

The present invention relates to a phosphor, a light emitting device using the same and a method for producing a phosphor, and particularly, to a phosphor, which is excited by light of a certain wavelength to emit light of a different wavelength, and a light emitting device using the same. More particularly, the present invention relates to a phosphor for emitting white light by light of a specific wavelength, a white light emitting device using the same and a method for producing the phosphor.

BACKGROUND ART

The method for producing a white light emitting device that has been actively developed in worldwide in recent years is roughly divided into a phosphor application method, i.e., a single chip method for obtaining a white color by adding a phosphor over a blue or ultraviolet light emitting device, and a multi-chip method for obtaining a white color by combining a plurality of light emitting chips in a multi-chip con-figuration.

Concretely, in the representative method for making a white light emitting device in the aforementioned multi-chip configuration, three chips of RGB (Red, Green, Blue) are combined to manufacture a white light emitting device. However, such a method is problematic in that the output of each chip changes according to the non-uniformity of an operating voltage of each chip and an environmental temperature, thus changing a color coordinate. Due to this problem, the multi-chip method can be properly applied for the purpose of special lighting requiring display of various colors by adjusting the brightness of each light emitting device through a circuit configuration rather than by making a white light emitting device.

Under this background, as a preferable method serving as a method for making a white light emitting device, mainly used is a system in which a blue light emitting device relatively easy to manufacture and excellent in efficiency and a phosphor excited by the blue light emitting device to emit a yellow color are combined. As a representative example of such a system for emitting a white light using a phosphor, can be included a system in which Yttrium Aluminum Garnet (YAG) phosphor using a blue light emitting device as an excitation light source and using cerium ions ($Ce^{3+}$) serving as trivalent rare earth ions, that is to say, a YAG:Ce phosphor, is excited by excitation light coming from the blue light emitting device.

The white light emitting device can be used in various types of packages according to the field of use. The white light emitting device is roughly divided into a micro chip light emitting diode manufactured in a surface mounting device (SMD) type for use in backlighting of cell phones and a vertical lamp type for use in electric signs, solid state display devices and image display.

Meanwhile, indexes used for analyzing the optical characteristics of a white light emitting device include a correlated color temperature (CCT) and a color rendering index (CRI).

When an object emits the same color visible light as that radiated by a black body at a certain temperature, the black body's temperature is referred to as the color temperature of the object. This temperature is defined as the correlated color temperature (CCT). The higher the color temperature, the colder and more bluish white the light will be. That is to say, if the color temperature of a white light is low, the color becomes warmer, while if the color temperature of the same white light is high, the color becomes cooler. Thus, by adjusting the color temperature, even the characteristics of special lighting requiring various color senses can be satisfied.

The white light emitting device using the YAG:Ce phosphor is problematic in that it has more or less a high color temperature ranging from 6000 to 8000 k.

The color rendering index identifies the degree of color shift objects undergo when illuminated by an artificial light source as compared to natural outdoor sunlight. If the color appearance of the object does not change when exposed to the sunlight, the CRI is 100. That is, the color rendering index is an index that measures how closely an artificial light source matches the natural colors of sunlight, and ranges from 0 to 100. Thus, the closer the CRI of a white light source is to 100, the more closely colors perceived by human eyes will appear as they do in sunlight.

At present, an incandescent lamp has a CRI of 80 or more and a fluorescent lamp has a CRI of 75 or more, while a commercialized white LED has a CRI of approximately 70 to 75, which is not very high.

Consequently, a conventional white light emitting device using a YAG:CE phosphor has a problem of a relatively high color temperature and a relatively low color rendering index. Besides, since it only employs the YAG:CE phosphor, it is difficult to control color coordinate, color temperatures and color rendering indexes.

Moreover, since the YAG:Ce is thermally degraded at a relatively high rate under a temperature of 100° C. or higher, and uses Y2O3 out of natural materials and requires a high temperature heat treatment of 1500° C. or higher for synthesizing the YAG:Ce, the YAG:Ce is disadvantageous in terms of production cost.

Further, in case of doping trivalent rare earth ions in order to shift the main emission peak of the YAG:Ce to a red region, the light emission luminosity is decreased.

DISCLOSURE OF INVENTION

Technical Problem

It is an object of the present invention to provide a phosphor which is contained in a mold material of a light emitting device capable of shifting a main emission peak without a decrease in light emission luminosity.

Additionally, it is another object of the present invention to provide a light emitting device which is capable of controlling color coordinates, color temperatures and color rendering indexes by changing the concentration of an activator contained in the phosphor.

Additionally, it is yet another object of the present invention to propose a phosphor for obtaining light suited to various user preferences and a light emitting device using the phosphor.

Additionally, it is still another object of the present invention to propose a phosphor which reduces the manufacturing cost of a phosphor and a light emitting device and a light emitting device using the phosphor.

Technical Solution

To achieve the above objects, there is provided a phosphor according to one aspect of the present invention, characterized in that the phosphor has a chemical formula: Sr 4-XMgγBaZSi2O8:$Eu^{2+}$ X ($0<x<1$, $0 \leq y \leq 1$, $0 \leq z \leq 1$).

There is provided a light emitting device using a phosphor according to another aspect of the present invention, comprising: a light source; a support for supporting the light source; a light transmitting member provided at least one portion around the light source; and a phosphor having a chemical formula: Sr4-XMgγBaZSi2O8:Eu$^{2+}$ X (0<x<1, 0≦y≦1, 0≦z≦1) incorporated in the light transmitting member.

There is provided a lamp type light emitting device according to yet another aspect of the present invention, comprising: a light source; a support for supporting the light source; a light transmitting member provided at least one portion around the light source; and a phosphor having a chemical formula: Sr4-XMgγBaZSi2O8:Eu$^{2+}$ X (0<x<1, 0≦y≦1, 0≦z≦1) incorporated in the light transmitting member.

There is provided a surface mounting type light emitting device according to still another aspect of the present invention, comprising: a light source; a support for supporting the light source; a light transmitting member provided at least one portion around the light source; and a phosphor having a chemical formula: Sr4-XMgγBaZSi2O8:Eu$^{2+}$ X (0<x<1, 0≦y≦1, 0≦z≦1) incorporated in the light transmitting member.

Advantageous Effects

According to the proposed invention, a phosphor and light emitting device with improved light emission characteristics can be attained.

Furthermore, because it is possible to control color coordinates, color temperatures and color rendering indexes of a light emitting device, a light emitting device more suitable to user preferences can be attained.

Furthermore, the manufacturing cost of a light emitting device can be reduced.

BRIEF DESCRIPTION OF THE DRAWINGS

The objects of the present invention and the attendant advantages thereof will become more clearly understood by reference to the accompanying drawings wherein:

FIG. 1 is a view showing an emission spectrum depending on a change in Eu mole concentration of a phosphor according to the present invention;

FIG. 2 is a sectional view of a surface mounting type white light emitting device according to one embodiment of the present invention;

FIG. 3 is a sectional view of a vertical lamp type white light emitting device according to another embodiment of the present invention;

FIG. 4 is a view showing an emission spectrum of the white light emitting device according to the present invention; and FIG. 5 is a view showing a color coordinate transformation depending on a change in Eu mole concentration of the white light emitting device according to the present invention.

BEST MODE FOR CARRYING OUT THE INVENTION

Hereinafter, a phosphor and a light emitting device using the same according to the present invention will be described in detail with reference to the accompanying drawings.

The phosphor of the invention is characterized in that the phosphor is composed of strontium (Sr), magnesium (Mg), barium (Ba), silica (SiO2) and europium (Eu) at a ratio of Mathematical Formula 1.

Sr4-XMgγBaZSi2O8:Eu$^{2+}$ X (0<x<1, 0≦y≦1, 0≦z≦1).    <Mathematical Formula 1>

The phosphor of Mathematical Formula 1 is characterized in that the main emission peak shifts according to the mole concentration of Eu, an activator.

FIG. 1 is a view showing an emission spectrum depending on a change in Eu mole concentration of a phosphor according to the present invention. In the emission spectrum of the phosphor of this invention having the chemical formula: Sr4-XMgγBa ZSi2O8:Eu$^{2+}$ X (0<x<1, 0≦y≦1, 0≦z≦1), the main emission peak of the phosphor shifts according to the concentration of europium (Eu) serving as an activator. Here, there is shown the intensity of light for each wavelength depending on each mole concentration obtained when light with a main emission peak of 465 nm emitted from a gallium nitride diode is used as excitation light and the Eu concentration in the phosphor is 0.02 moles, 0.05 moles, 0.10 moles and 0.15 moles, respectively.

Referring to FIG. 1, in the phosphor having the chemical formula: Sr4-XMgγBaSi 2O8:Eu$^{2+}$ X (0<x<1, 0≦y≦1, 0≦z≦1), a main emission peak shifts according to a change in Eu concentration, and a main emission spectrum region is ranged from 500 to 600 nm.

Changes of the emission spectrum depending on the mole concentration of Eu will be described. It can be seen that the main emission peak of graph 1, which is an emission spectrum obtained when the concentration of Eu is 0.02 mol has a shorter wavelength than the main emission peak of graph 2, which is an emission spectrum obtained when the concentration of Eu is 0.05 mol, and the main emission peak of graph 3, which is an emission spectrum obtained when the mole concentration of Eu is 0.10 mol has a shorter wavelength than the main emission peak of graph 4, which is an emission spectrum obtained when the concentration of Eu is 0.15 mol.

These results, in combination, can be explained in this way: the higher the mole concentration of Eu in the phosphor of the present invention, the longer the main emission peak wavelength of light emitted from the phosphor.

The light emitted by the phosphor of the present invention is combined with near ultraviolet light used as an excitation light to produce white light, when used for a white light emitting device, and thus it can be used for the light emission device of the present invention for emitting white light. As a result of combining this result, it is preferred that the concentration of Eu2+ suitable for obtaining white light is 0.02 to 0.20 mol.

This phosphor of the present invention will be described in more detail based on a method for producing the same.

According to the present invention, there is provided a method of producing a phosphor having Mathematical Formula 1 comprising europium (Eu) activated with rare earth ions, the method comprising the following steps. First, the step of providing the stoichiometric quantities of an oxygen compound of rare earth metal, especially an oxygen compound of europium, and an oxygen compound of at least one element selected from the group consisting of strontium (Sr), magnesium (Mg) and barium (Ba) is carried out. Second, the step of mixing the oxygen compounds so as to form a mixture is carried out.

Third, the step of selectively adding at least one fluxing compound enough in quantity to act as a flux and selected from the group consisting of boride, chloride, fluoride, etc. into the mixture is carried out. Fourth, the step of thermally treating the mixture under reduction atmosphere of a predetermined temperature for a sufficient time so as to convert the mixture into silicate phosphor is carried out.

Each of the above steps will be described in more detail. The mixing step is typically used in this field and not specifically restricted, but mixing can be done by a mechanical method including ball milling or mixing in a high speed blender or ribbon blender. In this case, for a more efficient mixing, it would be good to use a small amount of solvent such as distilled water, alcohol, acetone, etc.

Next, the mixture is dried at 100 to 400° C. At this point, it is preferred to maintain this range because if the drying temperature is less than 100° C., the solvent is not evaporated, and if the drying temperature exceeds 400° C., a self-reaction may occur.

Next, the mixture is thermally treated under a mixture gas atmosphere of hydrogen and nitrogen to produce a phosphor.

The mixture gas is adopted to reduce an activator by a reaction between the mixture and a hydrogen gas. The volume ratio of nitrogen and hydrogen is preferably 75 to 98:25 to 2. The thermal treatment temperature is approximately 800 to 1500° C. for a sufficient time, preferably, 1200 to 1400° C. If this temperature is less than 800° C., silicate crystalline is not fully generated, thereby reducing the emission efficiency. If this temperature exceeds 1500° C., the latitude is lowered due to overreaction.

Hereinafter, a light emitting device using the phosphor according to the present invention will be described with reference to a cross sectional view thereof.

FIG. 2 is a sectional view of a surface mounting type white light emitting device according to one embodiment of the present invention.

As shown in FIG. 2, the white light emitting device according to the one embodiment of the present invention comprises: anode and cathode lead frames 210; a light emitting diode chip 220 generating light when a voltage is applied; a wire 230 for energizing the lead frames 210 and the light emitting diode chip 220; a light transmitting resin 240 for molding around the light emitting diode chip 220, and a phosphor 241 distributed over the light transmitting resin 240.

As the light emitting diode chip 220, used is a near ultraviolet light emitting diode chip that generates light having a main peak of an emission spectrum in a 400 to 480nm region when a voltage is applied. Instead of the near ultraviolet light emitting diode chip, a laser diode, a surface light emitting laser diode, an inorganic electroluminescence device, an organic electroluminescence device, etc. may be used as a light emitting device having a main emission peak in the same wavelength region. In the present invention, a light emitting diode chip of InGaN, which is a gallium nitride type, is employed according to a preferred embodiment.

As the light transmitting resin 240 used as a molding member, can be used a light transmitting epoxy resin, a silicon resin, a polyimide resin, a urea resin, an acryl resin, etc., preferably, a light transmitting epoxy resin or a light transmitting silicon resin.

The light transmitting resin 240 can be molded entirely around the light emitting diode chip 220 and be also molded partially in a light emitting region as needed. In other words, in case of a small-scale light emitting device, it is preferred to perform molding entirely, however, in case of a high output light emitting device, if molding is performed entirely, it may be disadvantageous for uniformly distributing the phosphor 241 distributed over the light transmitting resin 240 due to a large size of the light emitting diode chip 220. In this case, it is preferred to perform molding partially in the light emitting region.

As the phosphor 241 distributed over the light transmitting resin 240, a phosphor having the chemical formula: Sr4-XMgγBaZSi2O8:Eu$^{2+}$ X (0<x<1, 0≦y≦1, 0≦z≦1) explained in the present invention is used.

The average particle size of the phosphor 241 is preferably less than 20 mm. If the average particle size of the phosphor 241 exceeds 20 mm, this may cause a problem like the precipitation of the silicate type phosphor 241 in the production process of mixing with the light transmitting resin for molding, which is not preferable. More preferably, the average particle size of the phosphor 241 is 5 to 15 mm.

Further, as already explained, the concentration of Eu$^{2+}$ included in the phosphor 241 is preferably 0.02 to 0.20 mol.

As for the mixing weight ratio of the phosphor 241 mixed with the light transmitting resin 240, the content of the phosphor 241 with respect to the light transmitting resin 240 is preferably 5 to 50 wt %.

Especially, in a case where the white light emitting device of the present invention is a top view type, it is preferred that the concentration of Eu$^{2+}$ included in the phosphor 241 is 0.02 to 0.10 mol, and the content of the phosphor 241 with respect to the light transmitting resin 240 is 10 to 30 wt %.

Further, in a case where the white light emitting device is a side view type, it is preferred that the concentration of Eu$^{2+}$ included in the phosphor 241 is 0.08 to 0.15 mol, and the content of the phosphor 241 with respect to the light transmitting resin 240 is 5 to 20 wt %.

Meanwhile, the phosphor of the present invention can be utilized as a backlight source that is formed between a printed circuit pad and a keypad stacked on the printed circuit board for lighting the keypad.

In this case, in a case where the light emitted from the white light emitting device is white, it is preferred that the concentration of Eu$^{2+}$ included in the phosphor 241 is 0.02 to 0.10 mol, and the content of the phosphor 241 with respect to the light transmitting resin 240 is 15 to 50 wt %.

Meanwhile, in a case where the light emitted from the white light emitting device is bluish white, it is preferred that the concentration of Eu$^{2+}$ included in the phosphor 241 is 0.02 to 0.10 mol, and the content of the phosphor 241 with respect to the light transmitting resin 240 is 10 to 40 wt %.

FIG. 3 is a sectional view of a vertical lamp type white light emitting device according to another embodiment of the present invention;

As shown in FIG. 3, the white light emitting device according to the another embodiment of the present invention comprises: a pair of lead frames 310; a light emitting diode chip 320 generating light when a voltage is applied; a wire 330 for energizing the lead frames 310 and the light emitting diode chip 320; a light transmitting resin 340 for molding around the light emitting diode chip 320, and a phosphor 341 distributed over the light transmitting resin 340; and an armoring material 350 for finishing the exterior space of the entire device.

The light transmitting resin 340 can be molded entirely around the light emitting diode chip 320 and be also molded partially in a light emitting region as needed. The reason of which has been stated above.

As the phosphor 341 distributed over the light transmitting resin 340, a phosphor having the chemical formula: Sr4-XMgγBaZSi2O8:Eu$^{2+}$ X (0<x<1, 0≦y≦1, 0≦z≦1) explained above in detail is used.

The average particle size of the phosphor 341 is less than 20 mm.

Preferably, the average particle size of the phosphor 341 is 5 to 15 mm.

Preferably, the concentration of Eu$^{2+}$ included in the phosphor 341 is preferably 0.02 to 0.10 mol, and the content of the phosphor 341 with respect to the light transmitting resin 340 is 10 to 30 wt %.

The light emitting diode chip 320, light transmitting resin 340, phosphor 341, etc. used in the vertical lamp type white light emitting diode has the equivalent configuration as the surface mounting type white light emitting device, a detailed description thereof will be omitted.

Meanwhile, although the content of the phosphor of the present invention applied to general light emitting devices with respect to the light transmitting resin is 5 to 50 wt %, in case of a high output light emitting diode, the content of the phosphor of the present invention with respect to the light transmitting resin can be increased up to 50 to 100 wt %.

The procedure of attaining white light in the surface mounting type white light emitting device or vertical lamp type white light emitting device according to the present invention that has been described above in detail will be explained in detail.

Blue light of a 400 to 480 nm wavelength region corresponding to near ultraviolet light emitted from the InGaN light emitting diode chips 220 and 320 passes through the phosphors 241 and 341. Here, parts of the light excite the phosphors 241 and 341 to generate light having a main peak of a 500 to 600 nm band at the center of a light emitting wavelength, and the remaining light is transmitted as blue light.

As a result, as shown in FIG. 4 showing the emission spectrum of the white light emitting device according to the embodiments of the present invention, white light having a spectrum of a wide wavelength of 400 to 700 nm is shown.

FIG. 5 is a view showing a color coordinate transformation depending on a change in Eu mole concentration of the white light emitting device according to the embodiments of the present invention.

Each of the graphs suggested in FIG. 5 shows a color coordinate transformation of the white light emitting device according to each mole concentration when light having a main emission peak of 455 nm is used as excitation light and the concentration of Eu$^{2+}$ included in the phosphor 341 is 0.02 mol, 0.05 mol, 0.10 mol and 0.12 mol, respectively, in the phosphor of the present invention.

That is, a first chromaticity graph 11, a second chromaticity graph 12, a third chromaticity graph 13 and a fourth chromaticity graph 14, obtained when the mole concentration of Eu is 0.02 mol, 0.05 mol, 0.10 mol and 0.12 mol, respectively, in the phosphor having the chemical formula: Sr4-XMgγBaZSi2O8:Eu$^{2+}$ X (0<x<1, 0≦y≦1, 0≦z≦1).

As shown above, in case of implementing a white light emitting device by changing the mole concentration of Eu$^{2+}$ applied to the phosphor of the present invention, color coordinates, color temperatures and color rendering indexes are changed according to the mole concentration of Eu$^{2+}$, thereby enabling to control the device so as to emit a desired white light.

MODE FOR THE INVENTION

The phosphor of the present invention allows to control color coordinates, color temperatures and color rendering indexes so as to emit a desired white light by properly adjusting the concentration of an activator contained in the phosphor. Especially, the state of white light is specifically controlled by controlling the concentration of Eu$^{2+}$.

It is emphasized that the specific configuration of the light emitting device may be varied or altered without departing from the scope of the present invention. For example, the specific shape of the light emitting device may be varied or altered, and the physical arrangement or the like of the light emitting device is not specifically limited.

INDUSTRIAL APPLICABILITY

The present invention is capable of controlling color coordinates, color temperatures and color rendering indexes by shifting a main emission peak without a decrease in light emission luminosity by changing the concentration of an activator included in a phosphor. Therefore, it is possible to actively control the state of white light according to use.

Furthermore, the present invention offers practicality that allows the light emitting device to be used as an energy-saving lighting source substituting for a color LCD backlight of a cellular phone, a LED lamp, and an in-car LED or fluorescent lamp of a train or bus.

While the embodiments of the invention has been described with reference to the accompanying drawings, the present invention is not limited thereto, and it will be obvious to those skilled in the art that various changes in form and details may be made without departing from the spirit and scope of the invention.

The invention claimed is:

1. A phosphor having the chemical formula:

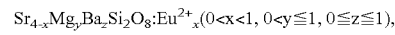

$Sr_{4-x}Mg_yBa_zSi_2O_8:Eu^{2+}_x (0<x<1, 0<y≦1, 0≦z≦1)$, wherein when the phosphor is excited by light having a main peak ranging from 400 to 480 nm, the phosphor has a main emission peak ranging from 500 to 600 nm.

2. The phosphor of claim 1, wherein the average particle size of the phosphor is less than 20 μm.

3. The phosphor of claim 1, wherein the average particle size of the phosphor is 5 to 15 μm.

4. The phosphor of claim 1, wherein a main emission peak of the phosphor shifts according to the concentration of Eu$^{2+}$.

5. The phosphor of claim 1, wherein the mole concentration of Eu$^{2+}$ is 0.02 to 0.20 mol.

6. A light emitting device including a phosphor, comprising:
   a light source;
   a support for supporting the light source;
   a light transmitting member provided at least one portion around the light source; and
   a phosphor having a chemical formula: $Sr_{4-x}Mg_yBa_zSi_2O_8$: $Eu^{2+}_x (0<x<1, 0<y≦1, 0≦z≦1)$ incorporated in the light transmitting member,
   wherein when the phosphor is excited by light having a main peak ranging from 400 to 480 nm, the phosphor has a main emission peak ranging from 500 to 600 nm.

7. The light emitting device of claim 6, wherein the concentration of Eu$^{2+}$ is 0.02 to 0.20 mol.

8. The light emitting device of claim 6, wherein the light transmitting member is a molding member.

9. The light emitting device of claim 6, wherein the mixing ratio of the phosphor with respect to the light transmitting member is 5 to 50 wt %.

10. The light emitting device of claim 6, wherein the light transmitting member is molded entirely around the light emitting device.

11. The light emitting device of claim 6, wherein the light transmitting member is molded partially around the light emitting device.

12. The light emitting device of claim 6, wherein white light is emitted by combining the light emitted from the light source and light excited by the phosphor.

13. The light emitting device of claim 6, wherein the concentration of $Eu^{2+}$ included in the phosphor is 0.02 to 0.20 mol.

14. The light emitting device of claim 6, wherein in a case where the light emitting device is a top view type, the concentration of $Eu^{2+}$ is 0.02 to 0.10 mol.

15. The light emitting device of claim 14, wherein the content of the phosphor with respect to the light transmitting member is 10 to 30 wt %.

16. The light emitting device of claim 6, wherein in a case where the light emitting device is a side view type, the concentration of $Eu^{2+}$ included in the phosphor is 0.08 to 0.15 mol.

17. The light emitting device of claim 16, wherein the content of the phosphor with respect to the light transmitting member is 5 to 20 wt %.

18. The light emitting device of claim 6, wherein in a case where the light emitting device is used as a white light source of a backlight, the concentration of $Eu^{2+}$ included in the phosphor is 0.02 to 0.10 mol, and the content of the phosphor with respect to the light transmitting member is 15 to 50 wt %.

19. The light emitting device of claim 6, wherein in a case where the light emitting device is used as a blue light source of a backlight, the concentration of $Eu^{2+}$ included in the phosphor is 0.02 to 0.10 mol, and the content of the phosphor with respect to the light transmitting member is 10 to 40 wt %.

20. The light emitting device of claim 6, wherein the light source is a gallium nitride light emitting diode.

21. A lamp type light emitting device including a phosphor, comprising:
a light source;
a support for supporting the light source;
a molding member provided at at least one portion around the light source; and
a phosphor having a chemical formula: $Sr_{4-x}Mg_yBa_zSi_2O_8:Eu^{2+}_x$ ($0<x<1$, $0<y\leq1$, $0\leq z\leq1$) incorporated in the molding member,
wherein when the phosphor is excited by light having a main peak ranging from 400 to 480 nm, the phosphor has a main emission peak ranging from 500 to 600 nm.

22. A surface mounting type light emitting device including a phosphor, comprising:
a light source;
a support for supporting the light source;
a molding member provided at least one portion around the light source; and
a phosphor having a chemical formula: $Sr_{4-x}Mg_yBa_zSi_2O_8:Eu^{2+}_x$ ($0<x<1$, $0<y\leq1$, $0\leq z\leq1$) incorporated in the molding member,
wherein when the phosphor is excited by light having a main peak ranging from 400 to 480 nm, the phosphor has a main emission peak ranging from 500 to 600 nm.

23. The phosphor of claim 1, wherein $0\leq z\leq1$ such that the phosphor comprises barium (Ba) and the chemical formula is $Sr_{4-x}Mg_yBa_zSi_2O_8:Eu^{2+}_x$ ($0<x<1$, $0<y\leq1$, $0\leq z\leq1$).

24. The light emitting device of claim 6, wherein $0<z\leq1$ such that the phosphor comprises barium (Ba) and the chemical formula is $Sr_{4-x}Mg_yBa_zSi_2O_8:Eu^{2+}_x$ ($0<x<1$, $0<y\leq1$, $0\leq z\leq1$).

25. The lamp type light emitting device of claim 21, wherein $0<z\leq1$ such that the phosphor comprises barium (Ba) and the chemical formula is $Sr_{4-x}Mg_yBa_zSi_2O_8:Eu^{2+}_x$ ($0<x<1$, $0<y\leq1$, $0\leq z\leq1$).

26. The surface mounting type light emitting device of claim 22, wherein $0<z\leq1$ such that the phosphor comprises barium (Ba) and the chemical formula is $Sr_{4-x}Mg_yBa_zSi_2O_8:Eu^{2+}_x$ ($0<x<1$, $0<y\leq1$, $0\leq z\leq1$).

* * * * *